(12) United States Patent
Yu et al.

(10) Patent No.: US 11,160,189 B2
(45) Date of Patent: *Oct. 26, 2021

(54) SERVER DEVICE AND ITS LATCH MECHANISM

(71) Applicant: CHENBRO MICOM CO., LTD., New Taipei (TW)

(72) Inventors: Cheng-Han Yu, New Taipei (TW); Ming-Huei Hsiao, New Taipei (TW); Chung-Hsin Tsai, New Taipei (TW)

(73) Assignee: CHENBRO MICOM CO., LTD., New Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 16/747,547

(22) Filed: Jan. 21, 2020

(65) Prior Publication Data

US 2020/0253082 A1    Aug. 6, 2020

(30) Foreign Application Priority Data

Feb. 1, 2019 (TW) ................................ 108104299

(51) Int. Cl.
*H05K 7/18* (2006.01)
*H05K 7/14* (2006.01)

(52) U.S. Cl.
CPC .......... *H05K 7/183* (2013.01); *H05K 7/1489* (2013.01)

(58) Field of Classification Search
CPC ..... H05K 7/183; H05K 7/1489; H05K 7/1411
See application file for complete search history.

(56) References Cited

U.S. PATENT DOCUMENTS

| 6,945,619 B1 * | 9/2005 | Chen | A47B 88/467 312/334.47 |
|---|---|---|---|
| 7,988,246 B2 * | 8/2011 | Yu | A47B 88/43 312/334.4 |
| 8,408,506 B2 * | 4/2013 | Yu | A47B 88/43 248/219.1 |

(Continued)

FOREIGN PATENT DOCUMENTS

| CN | 102548333 A | 7/2012 |
|---|---|---|
| CN | 204695191 U | 10/2015 |

(Continued)

*Primary Examiner* — Stanton L Krycinski
(74) *Attorney, Agent, or Firm* — CKC & Partners Co., LLC

(57) ABSTRACT

A latch mechanism includes a frame, an elastic sheet, a sliding bracket, a hooking portion, and a resilient restoring member connected to the frame and the sliding bracket. The elastic sheet includes a fixing portion, a receiving portion and a fastening member. The fixing portion is fixed to the frame opposite to the fastening member. The sliding bracket includes a bracket body slidable between the elastic sheet and the frame, and a protruding portion received in the receiving portion. The hooking portion is connected to the bracket body, and removably hooked on an end surface of the frame. When the sliding bracket moves the protruding portion, the resilient restoring member and the hooking portion, the protruding portion pushes the fastening member into the frame, and the hooking portion is hooked by the end surface of the frame to keep the resilient restoring member not being resumed.

11 Claims, 14 Drawing Sheets

(56) References Cited

U.S. PATENT DOCUMENTS

| | | | | |
|---|---|---|---|---|
| 8,550,416 | B2* | 10/2013 | Yu | H05K 7/1489 |
| | | | | 248/298.1 |
| 9,198,323 | B1* | 11/2015 | Chen | H05K 7/1489 |
| 9,211,003 | B1* | 12/2015 | Chen | H05K 7/1489 |
| 9,229,492 | B2* | 1/2016 | Henderson | H05K 13/04 |
| 9,629,460 | B1* | 4/2017 | Chen | H05K 7/1489 |
| 9,681,574 | B1* | 6/2017 | Chen | E05B 65/44 |
| 9,894,798 | B2* | 2/2018 | Chen | A47B 88/90 |
| 9,992,906 | B2* | 6/2018 | Chen | A47B 88/493 |
| 10,021,977 | B2* | 7/2018 | Chen | A47B 88/43 |
| 10,028,406 | B2* | 7/2018 | Chen | H05K 7/1489 |
| 10,085,561 | B2* | 10/2018 | Chen | A47B 96/067 |
| 10,278,498 | B2* | 5/2019 | Chen | A47B 88/483 |
| 10,292,297 | B2* | 5/2019 | Chen | H05K 7/1489 |
| 10,368,460 | B1* | 7/2019 | Yang | H05K 7/1489 |
| 10,376,054 | B1* | 8/2019 | Chen | A47B 88/50 |
| 10,455,725 | B1* | 10/2019 | Hsu | A47B 57/38 |
| 10,631,639 | B2* | 4/2020 | Chen | A47B 88/473 |
| 10,667,424 | B2* | 5/2020 | Lin | H05K 7/1411 |
| 2005/0017614 | A1 | 1/2005 | Cirocco et al. | |
| 2015/0359123 | A1 | 12/2015 | Hsu et al. | |
| 2016/0128222 | A1 | 5/2016 | Hsiao | |
| 2019/0090634 | A1* | 3/2019 | Chen | A47B 88/483 |

FOREIGN PATENT DOCUMENTS

| | | |
|---|---|---|
| CN | 107703362 A | 2/2018 |
| CN | 207519019 U | 6/2018 |
| CN | 207519020 U | 6/2018 |
| CN | 108712844 A | 10/2018 |
| CN | 207940517 U | 10/2018 |
| TW | 507561 U | 10/2002 |
| TW | 535968 U | 6/2003 |
| TW | 587758 U | 5/2004 |
| TW | M241708 U | 8/2004 |
| TW | I433996 B | 4/2014 |
| TW | 201621528 A | 6/2016 |
| TW | 201622527 A | 6/2016 |
| TW | I604775 B | 11/2017 |

* cited by examiner

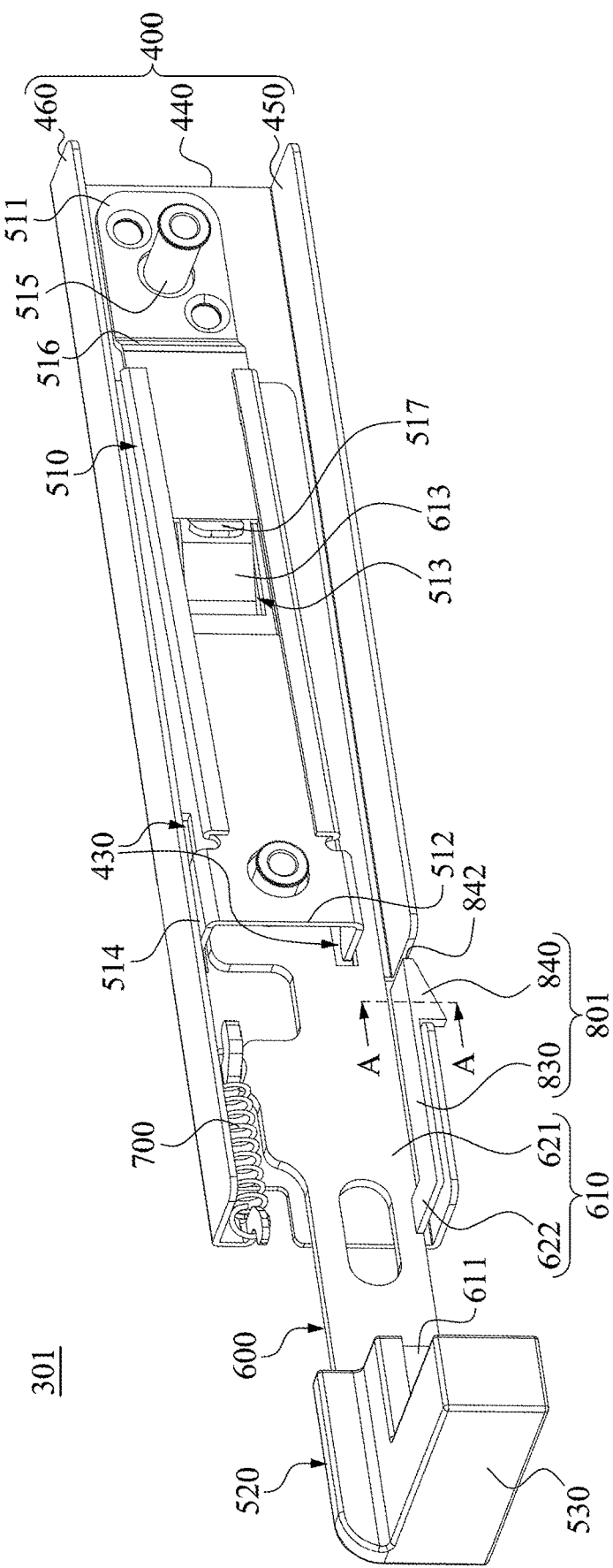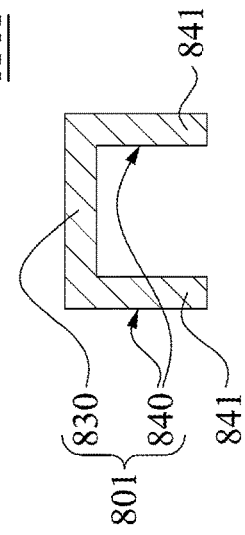

SERVER DEVICE AND ITS LATCH MECHANISM

RELATED APPLICATIONS

This application claims priority to Taiwan Application Serial Number 108104299, filed Feb. 1, 2019, which is herein incorporated by reference.

BACKGROUND

Field of Disclosure

The disclosure relates to a server device. More particularly, the disclosure relates to a server device having a latch mechanism.

Description of Related Art

A server rack of a conventional server equipment is loaded with a number of slidable server units stacked side by side therein. Each of the slidable server units is horizontally drawable along a sliding rail installed in the server rack so as to facilitate maintenance or replacement of a mainframe computer or a hard disk in the slidable server unit.

A stopping mechanism is installed at a traditional server unit so as to position the traditional server unit at a determined location in the server rack, and to prevent the traditional server unit from vibrating unexpectedly in the server rack, or even derailing from the sliding rail to cause safety concerns.

However, the stopping mechanism of the traditional server unit is still needed to be improved in a more convenient and user-friendly direction in terms of structural, assembling and operational aspects to increase user convenience and willingness to use.

SUMMARY

The present disclosure provides a server device and its latch mechanism to solve the aforementioned problems of the prior art.

In one embodiment of the disclosure, the latch mechanism includes a frame, an elastic sheet, a sliding bracket, a resilient restoring member and a hooking portion. The frame is provided with an accommodation space and a fastener portion which is an end surface of the frame. The elastic sheet is disposed in the accommodation space, attached on an inner surface of the frame. The elastic sheet includes a fixing portion, a receiving portion, a first free end and a fastening member. The fixing portion is fixedly connected to the frame, and located opposite to the first free end. The receiving portion is disposed between the fixing portion and the first free end. The fastening member is located at the first free end, and extended out of the frame from the accommodation space. The sliding bracket has a bracket body that is slidably disposed between the elastic sheet and the frame, and a protruding portion that is elastically and convexly located on the bracket body, and received in the receiving portion. The resilient restoring member is connected to the frame and the sliding bracket. The hooking portion is connected to the bracket body, and removably hooked on the front end surface of the frame. Thus, when the sliding bracket pulls the protruding portion, the resilient restoring member and the hooking portion together, the protruding portion is moved to a location between the elastic sheet and the frame so as to move the fastening member into the accommodation space of the frame, to fasten the hooking portion by the front end surface of the frame, and to deform the resilient restoring member so as to store a restoring force capable of returning the protruding portion back to the receiving portion.

According to one or more embodiments of the disclosure, in the foregoing latch mechanism, the frame includes a first plate member and a second plate member. The second plate member is located at one side of the first plate member. The fixing portion is disposed on the first plate member, and the fastener portion is a front end surface of the second plate member.

According to one or more embodiments of the disclosure, in the foregoing latch mechanism, the hooking portion includes a hook body and a torsion spring. The hook body is pivotably connected to the bracket body for hooking the fastener portion. The torsion spring is connected to the bracket body and the hook body for pushing the hook body towards the fastener portion.

According to one or more embodiments of the disclosure, in the foregoing latch mechanism, the bracket body includes a first sheet member and a second sheet member. The second sheet member is located at one side of the first sheet member, and is orthogonal to the first sheet member. The protruding portion is formed on the first sheet member. The hooking portion includes an elastic arm and a hook member. One end of the elastic arm is integrally formed on the second sheet member, the other end of the elastic arm has a second free end, and the hook member is located at the second free end of the elastic arm for hooking the fastener portion.

According to one or more embodiments of the disclosure, in the foregoing latch mechanism, the hook member includes two lugs which are respectively located at two opposite sides of the elastic arm, and commonly extend towards the same direction.

According to one or more embodiments of the disclosure, the foregoing latch mechanism further includes a grip portion. The grip portion is connected to one end of the bracket body facing away from the fixing portion.

According to one or more embodiments of the disclosure, in the foregoing latch mechanism, the grip portion is an L-shaped handle or a ring-shaped handle.

According to one or more embodiments of the disclosure, the foregoing latch mechanism further includes a grip portion. The grip portion includes a main body, a pivot shaft and a handle. The handle is connected to the main body. The main body is rotated to one end of the bracket body facing away from the fixing portion. The main body includes an inclined portion and an abutting portion that is adjacent to the inclined portion and is disposed opposite to the handle. A minimum linear distance between the pivot shaft and the abutting portion is greater than a minimum linear distance between the pivot shaft and the inclined portion. When the hook portion is fastened to the fastener portion, and the grip portion is rotated about an axis line of the pivot shaft to abut against a fixing object by the abutting portion, because the sliding bracket is detained by the fixing object and the fastener portion, respectively, the resilient restoring member is still deformed to keep storing the restoring force.

In one embodiment of the disclosure, the server device includes a server rack, a chassis and a foregoing latch mechanism. The server rack includes an internal space, a first sliding rail, a second sliding rail and a fixing hole. The first sliding rail and the second sliding rail are oppositely arranged in the internal space, and the fixing hole is formed on the first sliding rail. The chassis is removably received in the internal space, and slidably located on the first sliding rail and the second sliding rail. The latch mechanism mentioned above is fixedly disposed on the chassis, and removably hooked in the fixing hole through the fastening member. Thus, when the fastening member is pushed into the accommodating space, the fastening member is released from the fixing hole.

According to one or more embodiments of the disclosure, in the foregoing server device, the server rack further includes a trigger portion which is an outer end surface of the first sliding rail. Thus, when the chassis moves into the internal space to contact with the trigger portion, the trigger portion disengages the hooking portion from the fastener portion, so that the resilient restoring member releases the restoring force.

According to one or more embodiments of the disclosure, in the foregoing server device, the chassis is formed with a blocking surface. The latch mechanism includes a grip portion. The grip portion includes a main body, a pivot shaft, and a handle that is connected to the main body. The main body is rotated to one end of the bracket body facing away from the fixing portion, the main body includes an inclined portion and an abutting portion that is adjacent to the inclined portion and is disposed opposite to the handle, and a minimum linear distance between the pivot shaft and the abutting portion is greater than a minimum linear distance between the pivot shaft and the inclined portion. When the hook portion is fastened to the fastener portion, and the grip portion is rotated about an axis line of the pivot shaft to abut against a fixing object by the abutting portion, because the sliding bracket is detained by the fixing object and the fastener portion, respectively, the resilient restoring member is still deformed to keep storing the restoring force.

Thus, through the construction of the embodiments above, a user can mechanically complete the securing service of the chassis to the server rack through simple operations, which not only reduces and simplifies components, so as to further reduce material costs and structural complexity, but also increase user convenience and willingness to use.

The above description is merely used for illustrating the problems to be resolved, the technical methods for resolving the problems and their efficacies, etc. The specific details of the disclosure will be explained in the embodiments below and related drawings.

BRIEF DESCRIPTION OF THE DRAWINGS

The accompanying drawings are included to provide a further understanding of the disclosure, and are incorporated in and constitute a part of this specification. The drawings illustrate embodiments of the disclosure and, together with the description, serve to explain the principles of the disclosure. In the drawings.

FIG. 5A is a front view of a latch mechanism according to a second embodiment of the disclosure;

FIG. 5B is a partial cross-sectional view of the latch mechanism of FIG. 5A viewed along a line A-A;

DESCRIPTION OF THE EMBODIMENTS

Figure 1:
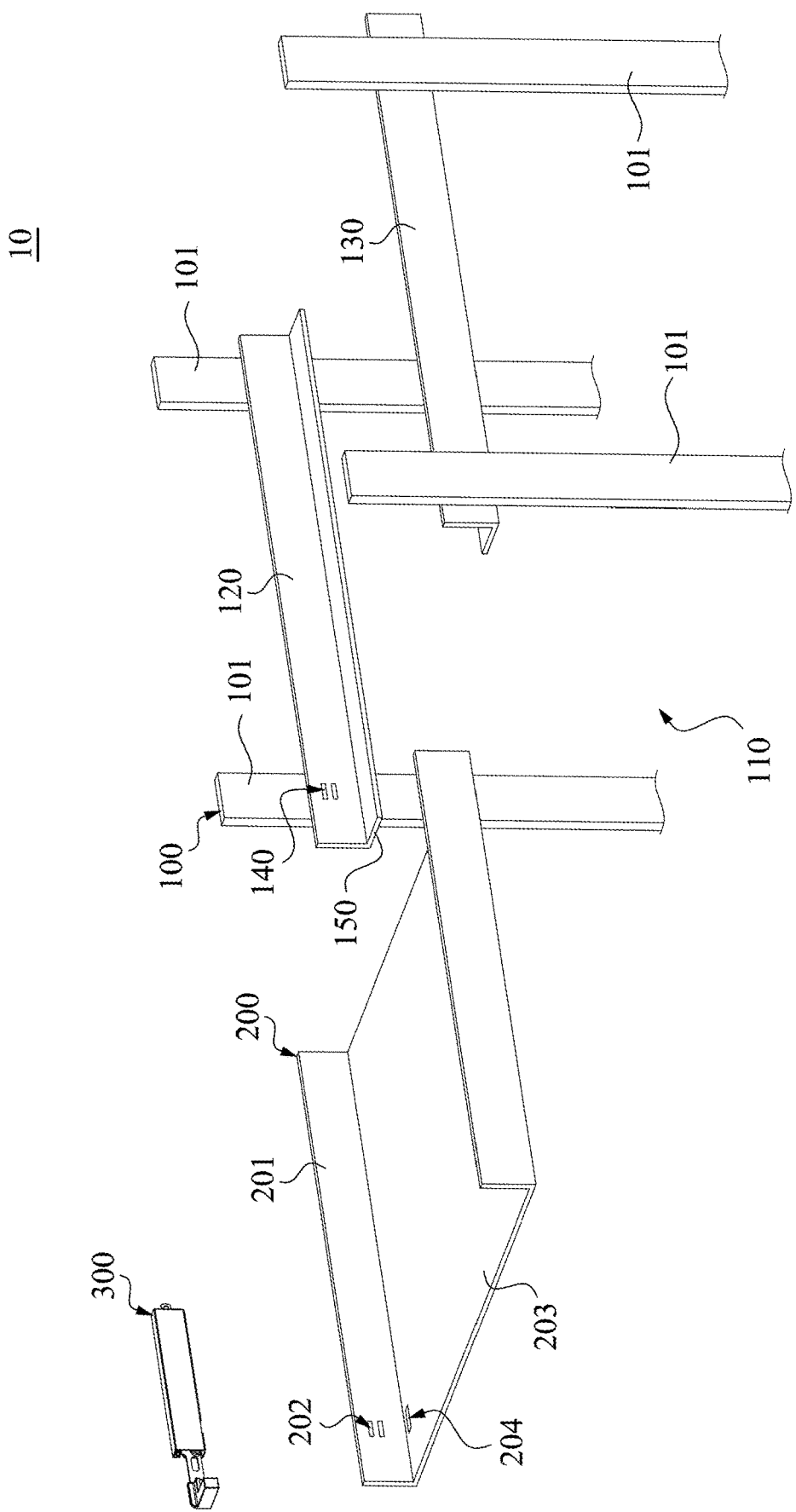
FIG. 1 is an exploded view of a server device according to one embodiment of the disclosure.

Reference will now be made in detail to the present embodiments of the disclosure, examples of which are illustrated in the accompanying drawings. Wherever possible, the same reference numbers are used in the drawings and the description to refer to the same or like parts. According to the embodiments, it will be apparent to those skilled in the art that various modifications and variations can be made to the structure of the disclosure without departing from the scope or spirit of the disclosure.

Reference is now made to FIG. 1 in which FIG. 1 is an exploded view of a server device 10 according to one embodiment of the disclosure. As shown in FIG. 1, the server device 10 includes a server rack 100, a chassis 200 and a latch mechanism 300. The server rack 100 includes an internal space 110, a first sliding rail 120 and a second sliding rail 130. The first sliding rail 120 and the second sliding rail 130 are respectively fixed on the server rack 100, and are oppositely arranged with each other in the internal space 110. The first sliding rail 120 is formed with at least one (e.g., two) fixing hole 140 thereon. The chassis 200 is slidably located on the first sliding rail 120 and the second sliding rail 130 so that the chassis 200 is able to be removably received in the internal space 110. The latch mechanism 300 is fixedly disposed on the chassis 200 so that the latch mechanism 300 can be moved synchronously with the chassis 200. The latch mechanism 300 is disposed on a side plate 201 of the chassis 200 corresponding to the first sliding rail 120. For example, the latch mechanism 300 is disposed on the inner side of the side plate 201 so as to be hooked to the fixing hole 140 via the through hole 202 of the side plate 201, thereby allowing the chassis 200 to be fixed on the server rack 100.

Figure 2:
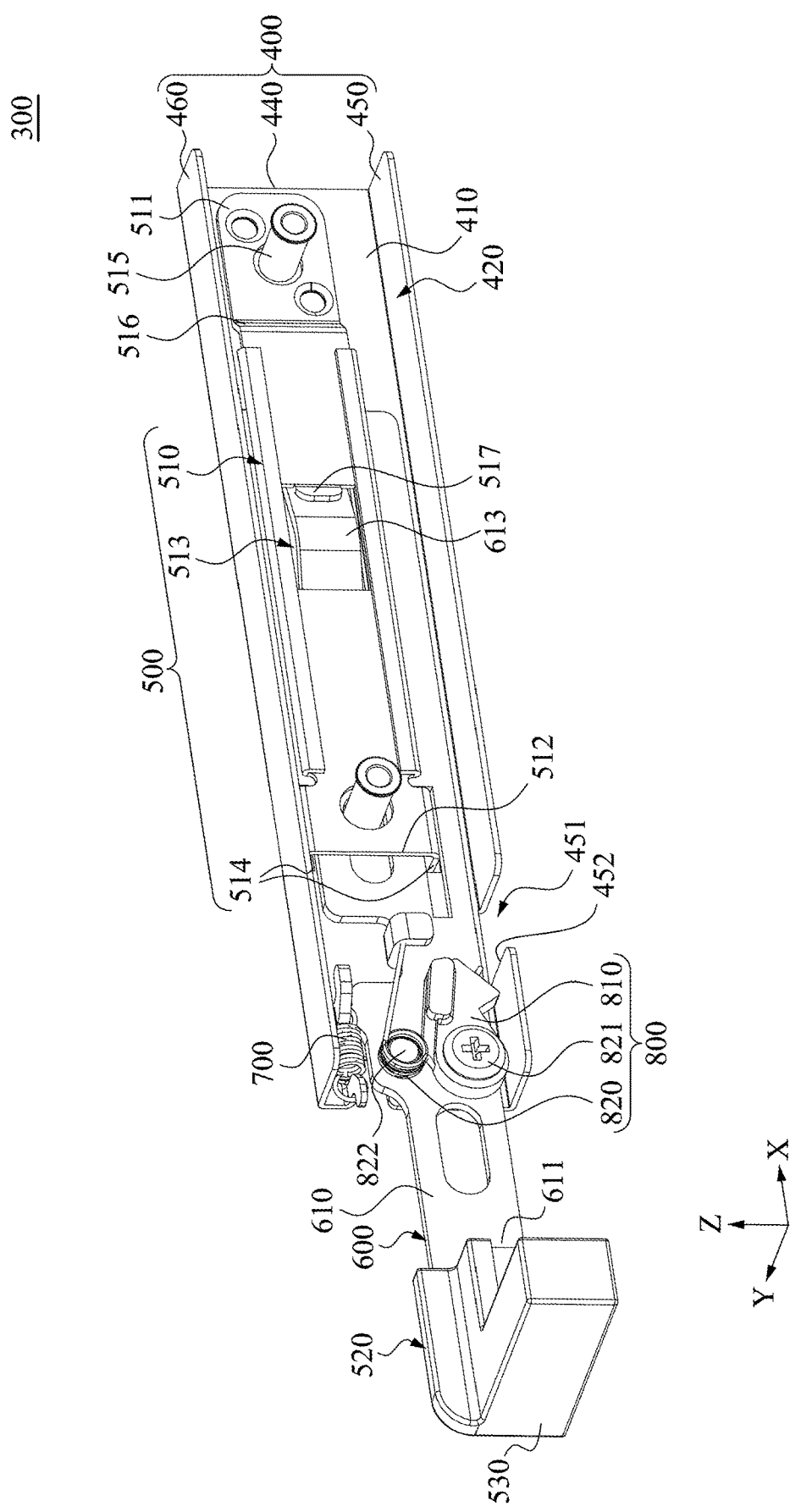
FIG. 2 is a perspective view of a latch mechanism according to a first embodiment of the disclosure.
Figure 3:
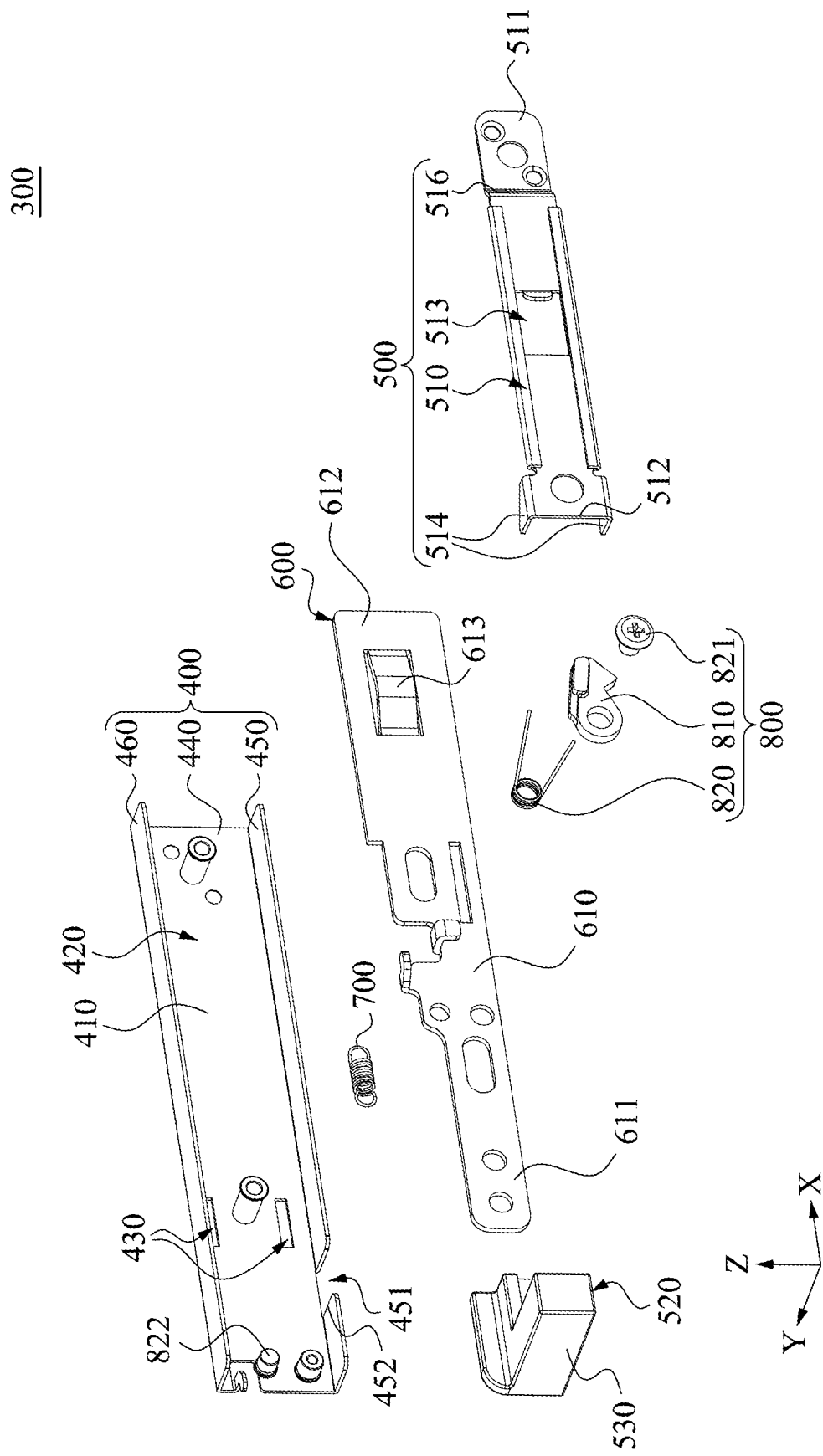
FIG. 3 is an exploded view of the latch mechanism of FIG. 2.

FIG. 2 is a perspective view of a latch mechanism according to a first embodiment of the disclosure, and FIG. 3 is an exploded view of the latch mechanism of FIG. 2. More specifically, as shown in FIG. 2 and FIG. 3, in the embodiment, the latch mechanism 300 includes a frame 400, an elastic sheet 500, a grip portion 520, a sliding bracket 600, a resilient restoring member 700 and a hooking portion 800. The frame 400 is provided with an accommodation space 420 and at least one (e.g., two) opening 430. Each of the openings 430 is formed on the inner surface 410 of the frame 400. The elastic sheet 500 is disposed in the accommodation space 420, and attached to an inner surface 410 of the frame 400. The elastic sheet 500 includes an elongated sheet body 510, a receiving portion 513 and at least one (e.g., two) fastening member 514. The elongated sheet body 510 includes a first end 511 and a second end 512 which are opposite to each other. The first end 511 is fixedly connected to the inner surface 410 of the frame 400 through a fixing member 515, and the second end 512 is a free end. The receiving portion 513 is located between the first end 511 and the second end 512 of the elongated sheet body 510, and the receiving portion 513, for example, is a penetrating hole; however, the disclosure is not limited thereto. In other embodiments, the receiving portion may also be a recessed portion of the elongated sheet body 510. The fastening members 514 are disposed on the second end 512 of the elongated sheet body 510, and extend out of the frame 400 through the openings 430, respectively. The elongated sheet body 510 also is provided with a bending portion 516 that is adjacent to the fixing member 515 so as to force the elastic sheet 500 to drive the fastening members 514 out of the frame 400 through the openings 430 of the frame 400.

The sliding bracket 600 includes a bracket body 610 and a protruding portion 613. The bracket body 610 is slidably disposed between the elastic sheet 500 and the frame 400. The protruding portion 613 is convexly located on the bracket body 610, and received in the receiving portion 513. The bracket body 610 includes a third end 611 and a fourth end 612 which are opposite to each other. The grip portion 520 is connected to the third end 611 of the bracket body 610, and extends out of the internal space 110 (FIG. 1). The grip portion 520 for example, is an L-shaped handle. The third end 611 of the bracket body 610 is closer to the fixing member 515 of the elongated sheet body 510. The resilient restoring member 700 for example, is a compression spring, and the resilient restoring member 700 is connected to the frame 400 and the sliding bracket 600. The hooking portion 800 is connected to the bracket body 610 for removably hooking to a fastener portion of the frame 400. In this embodiment, the fastening member 514 is located between the resilient restoring member 700 and the fixing member 515.

More specifically, the frame 400 includes a first plate member 440, a second plate member 450, and a third plate member 460. The second plate member 450 and the third plate member 460 are respectively located on two opposite sides of the first plate member 440 and commonly extend in a same direction (such as the Y-axis direction). The same direction (i.e., Y-axis direction) is orthogonal to the long axis direction (i.e., the X-axis direction) of the first plate member 440. The second plate member 450 is formed with a break 451, and the aforementioned fastener portion in the embodiment can be an inner side 452 of the break 451.

Furthermore, the hooking portion 800 includes a hook body 810 and a torsion spring 820. The hook body 810 is pivotably connected to the bracket body 610. The torsion spring 820 is held on the bracket body 610 through a post 822, and connected to the bracket body 610 and the hook body 810 for providing elastic force to continuously push the hook body 810 towards the second plate member 450.

Figure 4A:
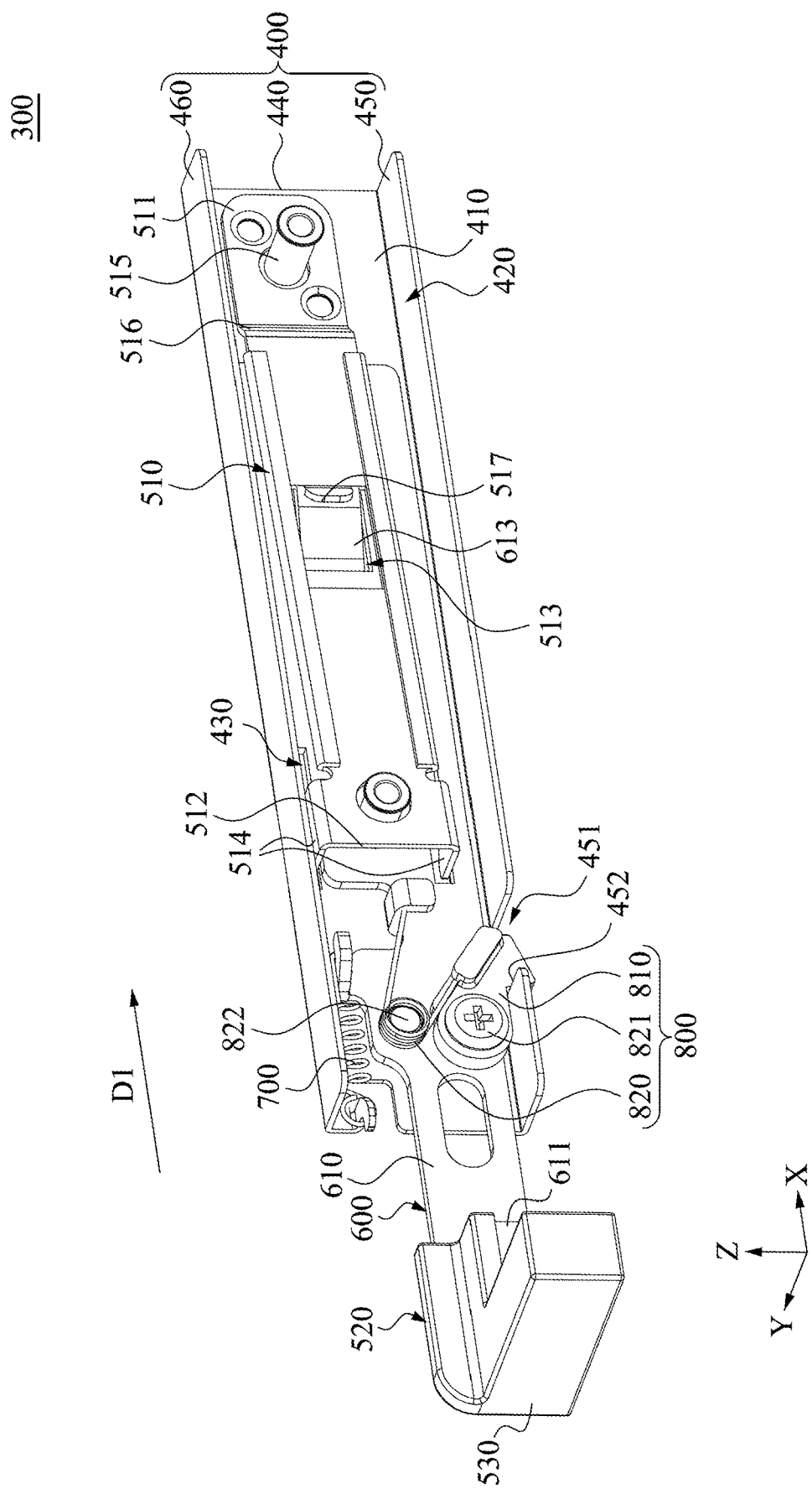
FIG. 4A is an operation schematic view of the latch mechanism of FIG. 3 in an unlocked status.
Figure 4B:
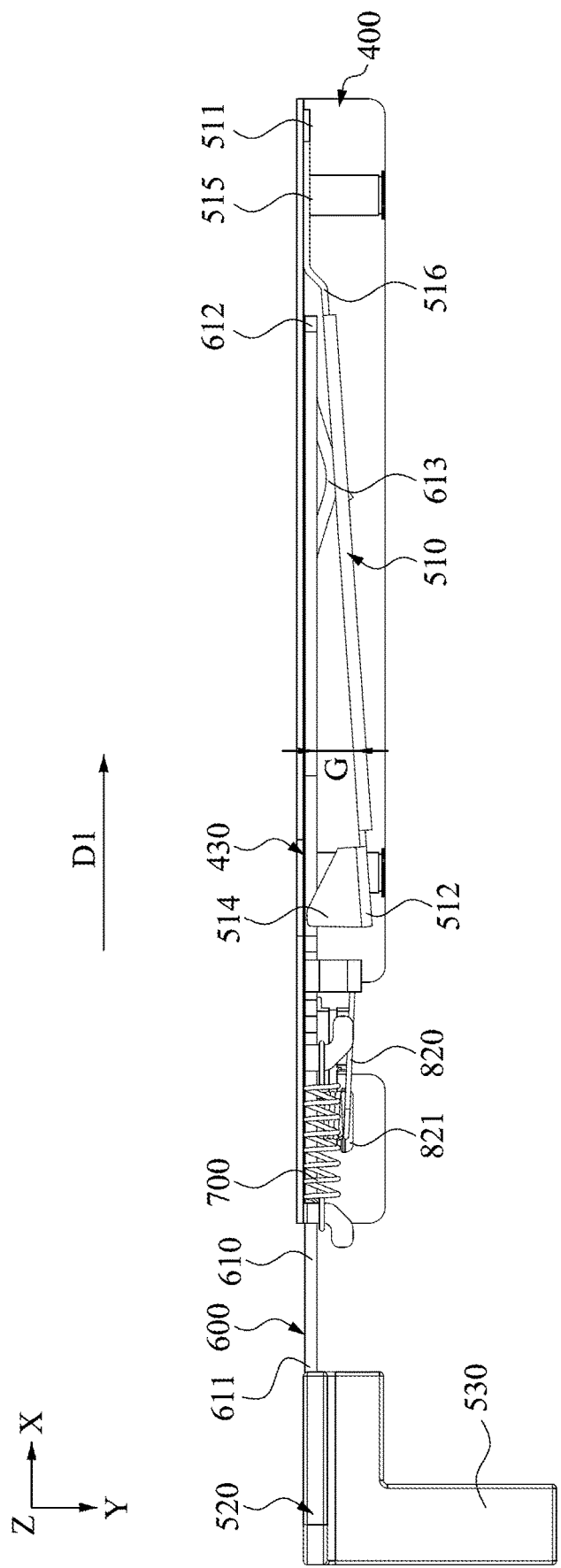
FIG. 4B is a top view of the latch mechanism of FIG. 4A.

FIG. 4A is an operation schematic view of the latch mechanism 300 of FIG. 3 in an unlocked status, and FIG. 4B is a top view of the latch mechanism 300 of FIG. 4A. As shown in FIG. 1, FIG. 4A and FIG. 4B, when the user pushes the grip portion 520 towards the internal space 110 (e.g., traveling direction D1), the sliding bracket 600 moves relative to the frame 400. Because the protruding portion 613 is moved into a location between the elastic sheet 500 and the frame 400 from the receiving portion 513 with the sliding bracket 600, therefore, the second end 512 of the elongated sheet body 510 is pushed to enlarge a gap G between the elastic sheet 500 and the frame 400 (FIG. 4B), so that the fastening members 514 are pulled back to the accommodation space 420 from the openings 430, that is, the fastening members 514 are respectively removed from the fixing holes 140 of the first sliding rail 120 (FIG. 1). Thus, the chassis 200 is no longer fixedly confined in the internal space 110 so that the chassis 200 can be pulled out of the internal space 110 of the server rack 100 (FIG. 1).

In addition, at the same time that the sliding bracket 600 moves relative to the frame 400, the resilient restoring member 700 starts to be compressed to be in a deformed state by the sliding bracket 600 and the frame 400, a restoring force capable of returning the protruding portion 613 back to the receiving portion 513 is stored. As the sliding bracket 600 is moved, the hook body 810 of the hooking portion 800 is pushed into the break 451 along the second plate member 450 so as to be hooked to the inner side 452 of the break 451, and the latch mechanism 300 temporarily stays in a mechanical equilibrium state which is also called a unlocked status.

It is noted, since each of the fastening members 514 is temporarily limited in the accommodation space 420 of the frame 400, and does not protrude out of the frame 400 via the corresponding opening 430, thus, while the chassis 200 is being pulled out, the fastening members 514 may be not interfered by the first sliding rail 120 to reduce the possibility of the damage to the fastening members 514 or the first sliding rail 120.

In addition, the elastic sheet 500 is further provided with a guiding portion 517. The guiding portion 517 is located on an edge of the elongated sheet body 510 facing towards the receiving portion 513, so that the protruding portion 613 can be smoothly moved into a position between the elastic sheet 500 and the frame 400.

Conversely, when the user pushes the chassis 200 into the internal space 110 of the server rack 100, once the hooking portion 800 extending outwardly via a recess 204 formed at the bottom plate 203 of the chassis 200 (FIG. 1) hits a trigger portion 150 of the server rack 100, the trigger portion 150 pushes the hooking portion 800 to return back to the accommodation space 420 of the frame 400 through the break 451 so as to remove from the break 451. Therefore, the restoring force of the resilient restoring member 700 which is not interfered by the sliding bracket 600 can automatically return the sliding bracket 600, the fastening members 514 and the hooking portion 800 to the original position (as shown in FIG. 2), and the user does not need to manually operate additionally, thereby improving user convenience and willingness to use. For example, the triggering portion 150 is a front edge or other side edge of the first sliding rail 120, however, the disclosure is not limited thereto.

Furthermore, as shown in FIG. 1, the server rack 100 includes four outer posts 101. The outer posts 101 are respectively arranged upright and spaced to collectively surround the above-mentioned internal space 110. The first sliding rail 120 is fixedly connected to two of the outer posts 101, and the second slide rail 130 is fixedly connected to the other two of the outer posts 101.

FIG. 5A is a front view of a latch mechanism 301 according to a second embodiment of the disclosure and FIG. 5B is a partial cross-sectional view of the latch mechanism of FIG. 5A viewed along a line A-A. As shown in FIG. 5A and FIG. 5B, in the embodiment, the latch mechanism 301 of this embodiment and the latch mechanism 300 of FIG. 2 are substantially the same, however, at least some differences of the latch mechanism 301 of this embodiment from that in FIG. 2 are that, the hooking portion 801 is a part of the bracket body 610 and is not an independent component that is pivotally connected to the bracket body 610. For example, but not for the limitation of the disclosure, the bracket body 610 includes a first sheet member 621 and a second sheet member 622. The second sheet member 622 is located at one side of the first sheet member 621, and is orthogonal to, or at least intersected with the first sheet member 621. The protruding portion 613 is formed on the first sheet member 621, and the first sheet member 621 is attached against the first plate member 440, and the second sheet member 622 is stacked on the second plate member 450, and the hooking portion 801 is integrally formed on the second sheet member 622. More specifically, the hooking portion 801 includes an elastic arm 830 and a hook member 840. One end of the elastic arm 830 is integrally formed on the second sheet member 622, the other end of the elastic arm 830 has a free end 842 extending towards the fixing member 515. The hook member 840 is located at the free end 842 of the elastic arm 830. Thus, when the sliding bracket 600 is pushed in the traveling direction D1 to cause the hook member 840 of the second sheet member 622 to be fallen into the break 451 for hooking with the inner side 452 of the break 451, the hook member 840 of the hooking portion 801 is able to allow the resilient restoring member 700 to store the restoring force described above.

As shown in FIG. 5B, more particularly, the hook member 840 includes two lugs 841 (e.g., wedged plate) which are respectively located at two opposite ends of the elastic arm 830, and commonly extend towards a same direction so as to conveniently complete the hooking portion 801.

Figure 6A:
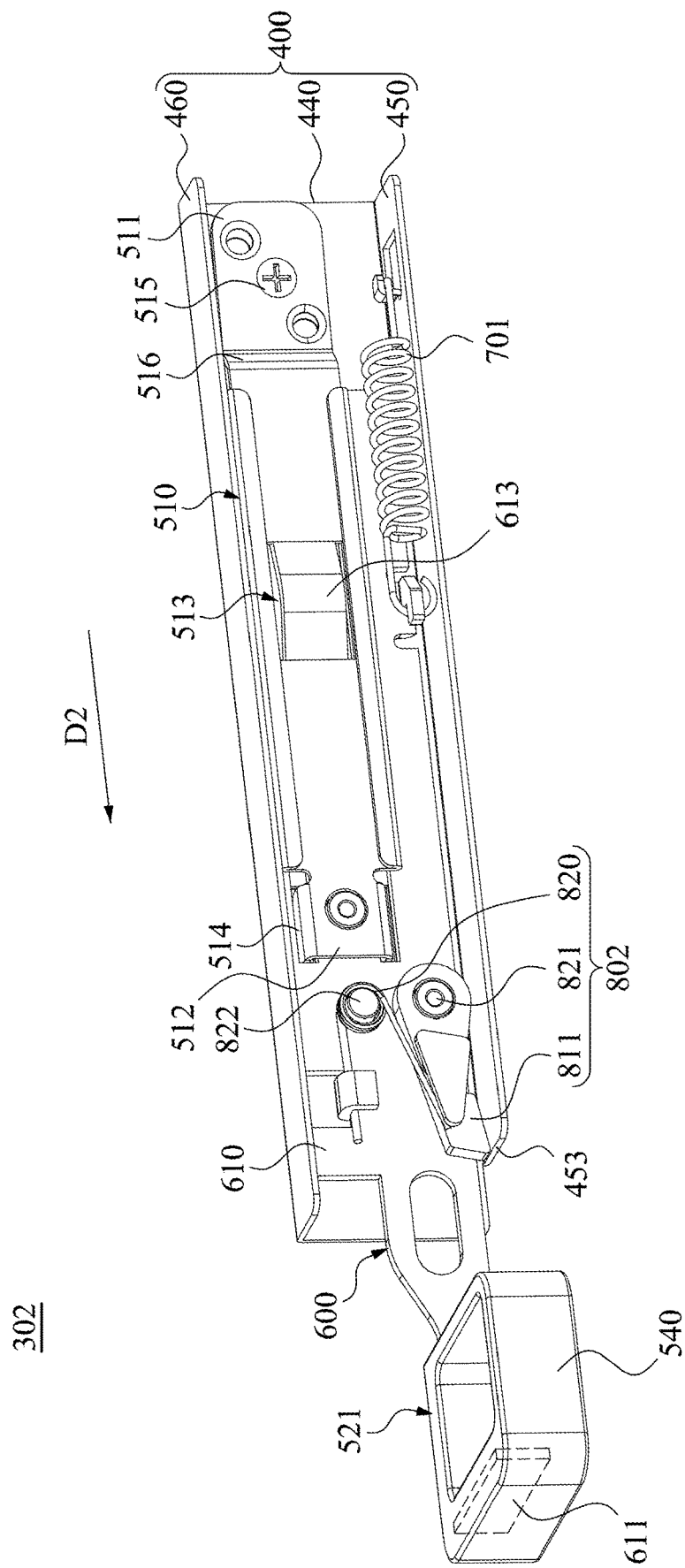
FIG. 6A is a perspective view of a latch mechanism according to a third embodiment of the disclosure.
Figure 6B:
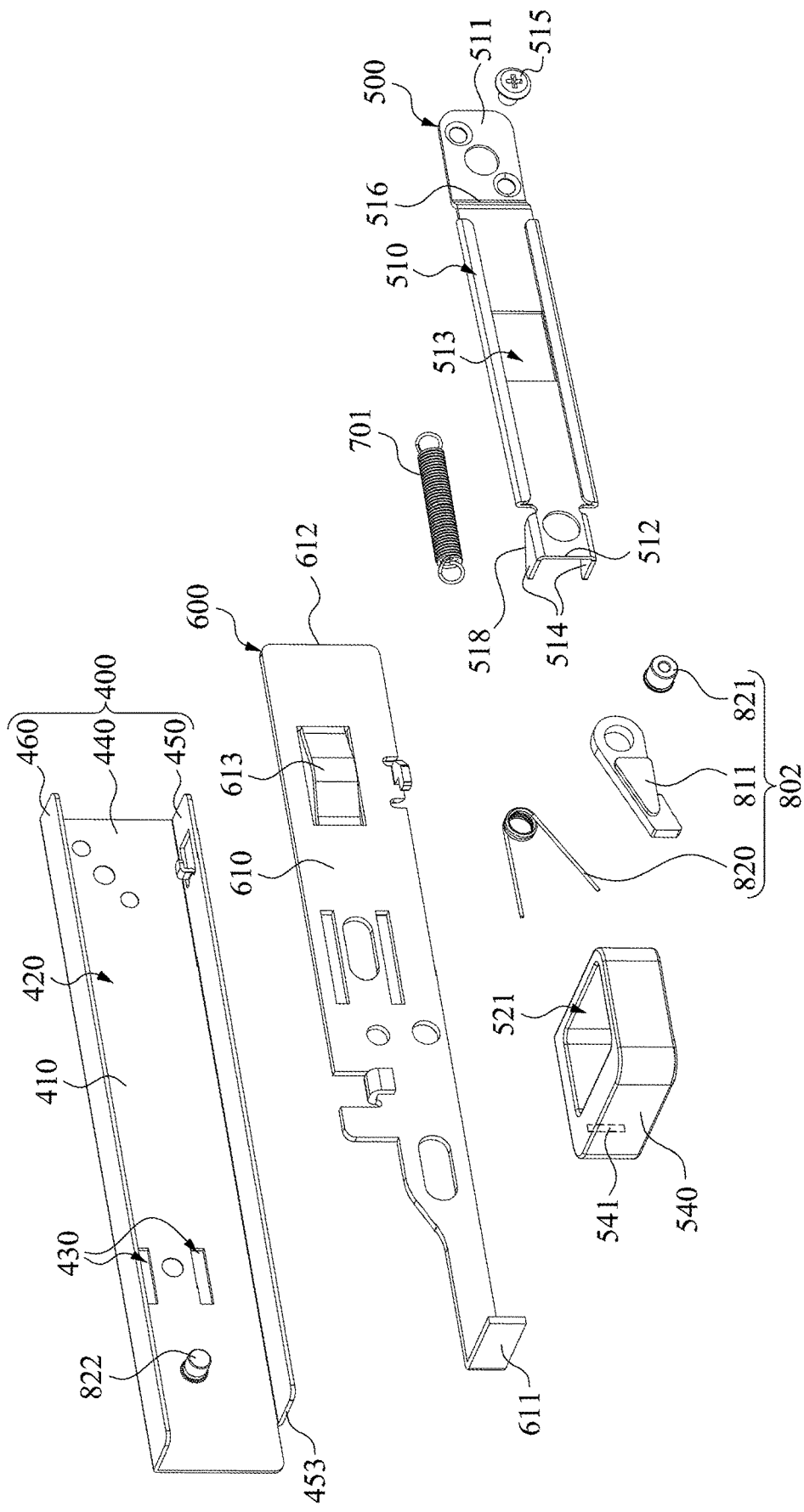
FIG. 6B is an exploded view of the latch mechanism of FIG. 6A.
Figure 7A:
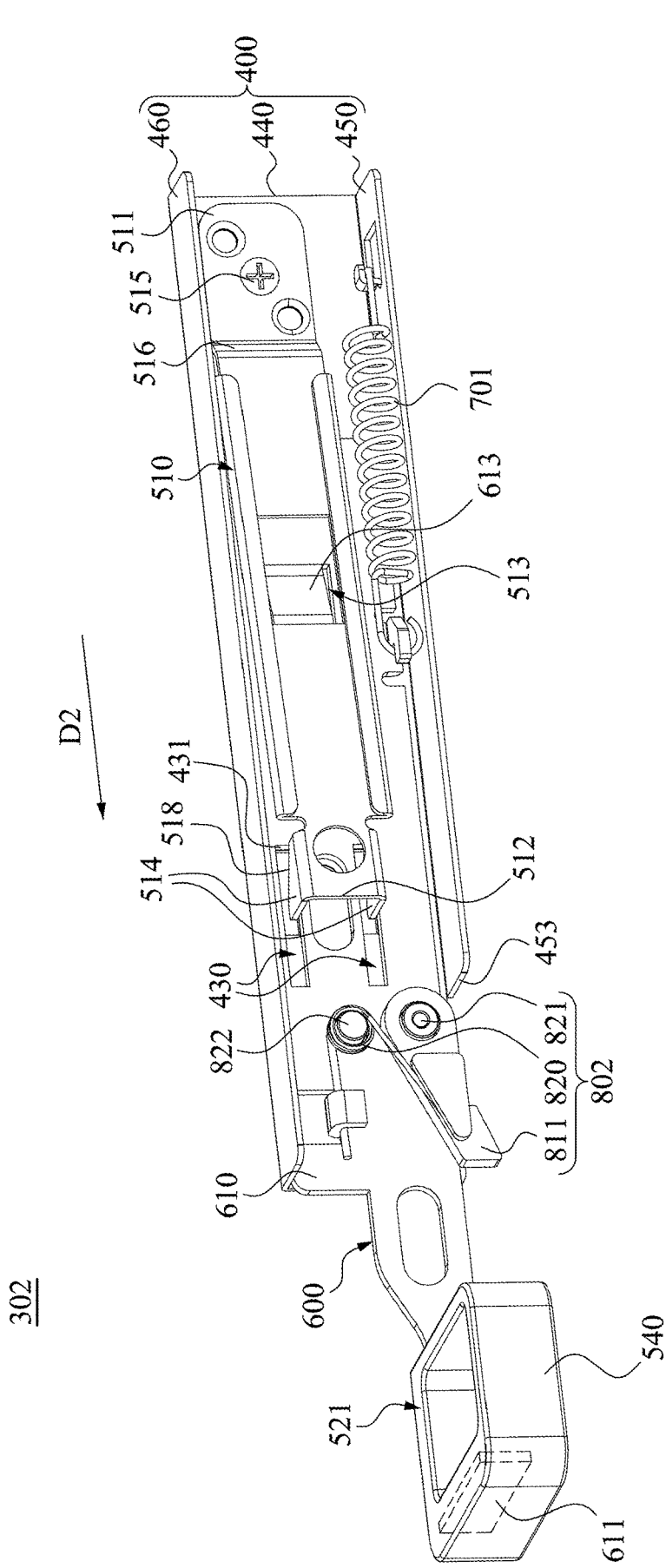
FIG. 7A to FIG. 7B are continuous operation views expressing the latch mechanism of FIG. 6A in an unlocked status.
Figure 7B:
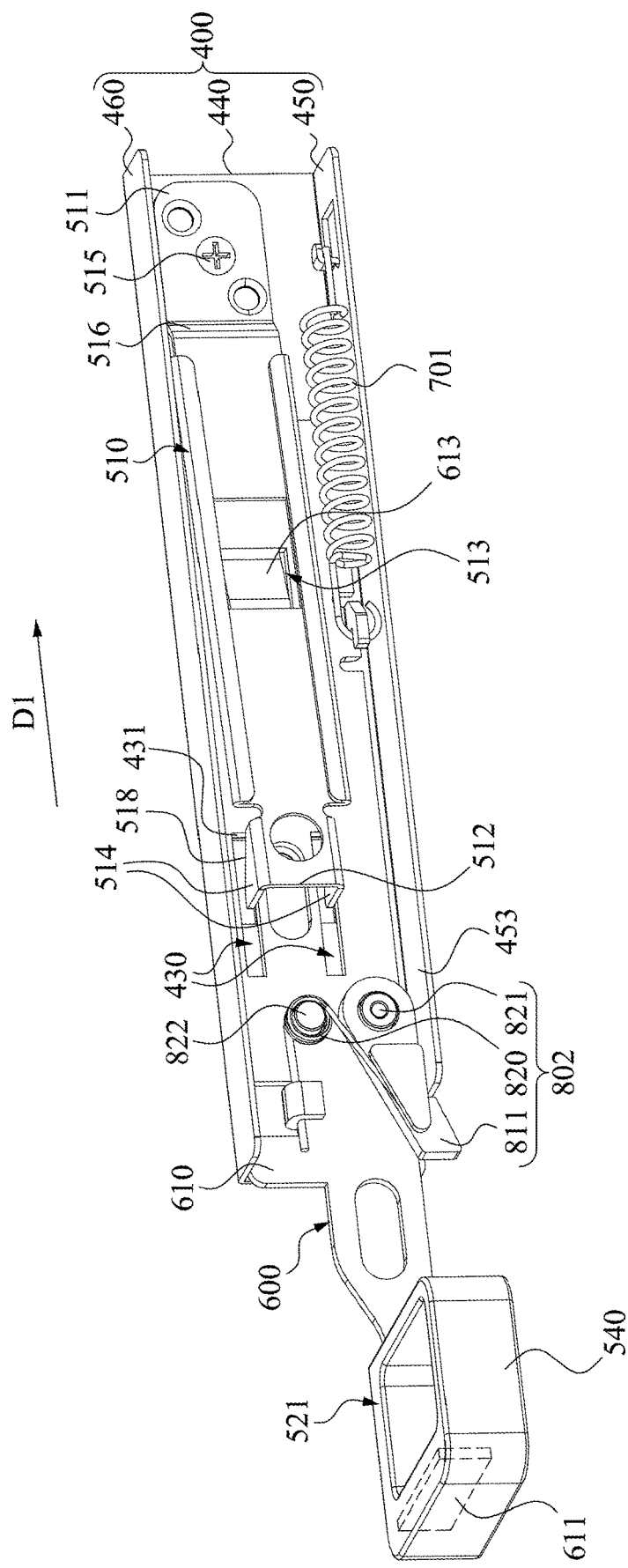

Reference is now made to FIG. 6 and FIG. 7A to FIG. 7B in which FIG. 6A is a perspective view of a latch mechanism 302 according to a third embodiment of the disclosure, FIG. 6B is an exploded view of the latch mechanism 302 of FIG. 6A, and FIG. 7A to FIG. 7B are continuous operation views expressing the latch mechanism 302 of FIG. 6A in an unlocked status. As shown in FIG. 6A, in the embodiment, the latch mechanism 302 of this embodiment and the latch mechanism 300 of FIG. 2 are substantially the same, however, at least some differences of the latch mechanism 302 of this embodiment from that in FIG. 2 are that, the aforementioned fastener portion in the embodiment is at a front end surface 453 of the second plate member 450 facing towards the grip portion 521, and is not the inner side 452 of the break 451, and the resilient restoring member 701 is a tension spring, and the grip portion 521 includes a ring-shaped handle 540. In this embodiment, the fastening member 514 is located between the resilient restoring member 701 and the ring-shaped handle 540. In this embodiment, the fastening member 514 is located between the resilient restoring member 701 and the ring-shaped handle 540. The third end 611 of the bracket 610 extends to insert into the assembly slot 541 of the ring-shaped handle 540 in the Y-axis direction to be fixed on the ring-shaped handle 540 for a user to grasp.

Thus, when the user pulls the grip portion 521 and the sliding bracket 600 in a direction (e.g., traveling direction D2) facing away from the internal space 110, as shown in FIG. 7A, because the protruding portion 613 is moved to a location between the elongated sheet body 510 and the frame 400 from the receiving portion 513 in the traveling direction D2, the fastening members 514 can be withdrawn back to the accommodation space 420 from the openings 430, and because the hook body 811 of the hooking portion 802 is removed from the surface of the second plate member 450, and the hook body 811 of the hooking portion 802 can be pushed downwardly by the torsion spring 820.

Next, when the user no longer pulls the grip portion 521 and the sliding bracket 600, the restoring force of the resilient restoring member 701 will move the grip portion 521 and the sliding bracket 600 in the opposite direction (i.e., movement direction D1), so that the hook body 811 of the hooking portion 802 is moved to the front end surface 453 of the second plate member 450 (FIG. 7A), the hook body 811 of the hooking portion 802 can be hooked to the front end surface 453 of the second plate member 450 (FIG. 7B), so that the latch mechanism 302 is temporarily unlocked in the unlocked status mentioned above.

It is noted, each of the fastening members 514 has a hook shape with a sloping edge 518, and each of the openings 430 has an inner edge 431. Therefore, when the sliding bracket 600 is pulled in the traveling direction D2, the inner edge of each of the opening 430 pushes the sloping edge 518 of each of the fastening members 514, so that the protruding portion 613 can be smoothly moved into a gap between the elongated sheet body 510 and the frame 400 to expand the gap between the elongated sheet body 510 and the frame 400.

In addition, in this embodiment, the hooking portion 802 in FIG. 6A can also be replaced with the hooking portion 801 in FIG. 5A, as long as the free end of the elastic arm of the second sheet member of the bracket faces towards the ring-shaped handle so that the hook member can be hooked to the front end surface 453 mentioned above to store the restoring force of the elastic resetting member 701.

Figure 8:
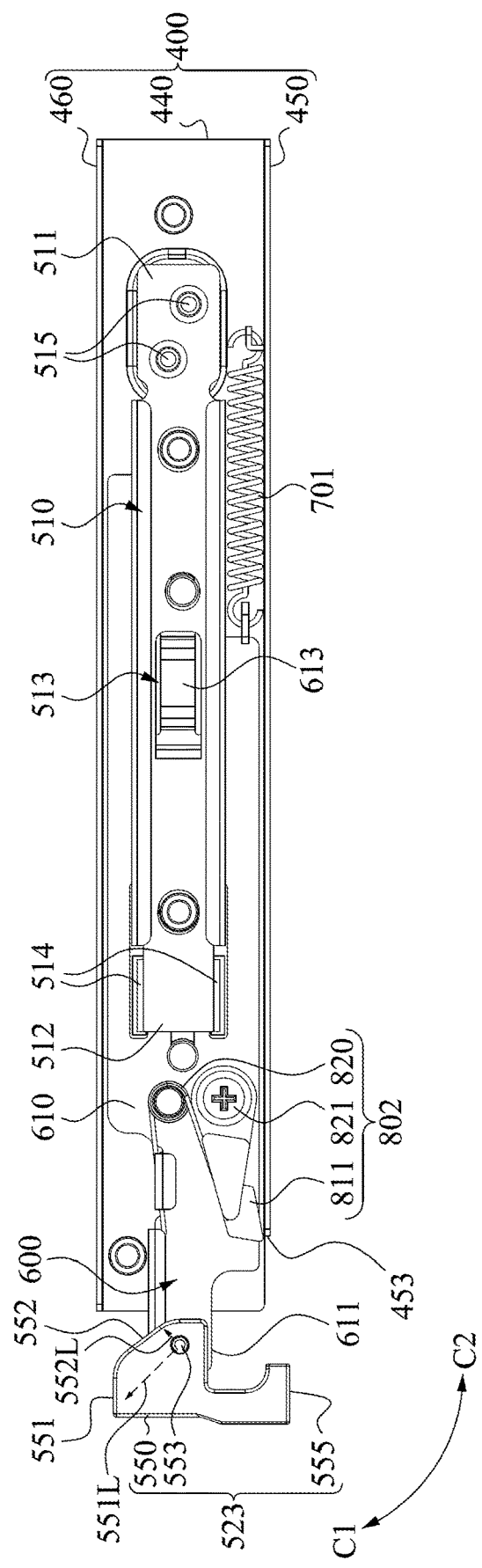
FIG. 8 is a perspective view of a latch mechanism according to a fourth embodiment of the disclosure.

FIG. 8 is a perspective view of a latch mechanism 303 according to a fourth embodiment of the disclosure. As shown in FIG. 8, in the embodiment, the latch mechanism 303 of this embodiment and the latch mechanism 302 of FIG. 6A are substantially the same, however, at least some differences of the latch mechanism 303 of this embodiment from that in FIG. 6 are that, the grip portion 523 of the latch mechanism 303 is pivotally connected to the bracket body 610, not fixedly connected to the bracket body 610.

Specifically, the chassis 200 is formed with a blocking surface 210, and the blocking surface 210 is located at one surface of the chassis 200 facing towards the grip portion 523. The grip portion 523 includes a main body 550, a pivot shaft 553 and a handle 555. The handle 555 is connected to one side of the main body 550. The main body 550 is pivotally connected to one end of the bracket body 610 facing away from the fixing member 515 by the pivot shaft 553, so that the main body 550 can be rotated relative to the sliding bracket 600 about the axis line of the pivot shaft 553. More specifically, the main body 550 includes an abutting portion 551 and an inclined portion 552. The abutting portion 551 is adjacent to the inclined portion 552 and is disposed opposite to the handle 555. A minimum linear distance 551L between the pivot shaft 553 and the abutting portion 551 is greater than a minimum linear distance 552L between the pivot shaft 553 and the inclined portion 552. In other words, the pivot shaft 553 is not on a centroid of the main body 550.

Figure 9A:
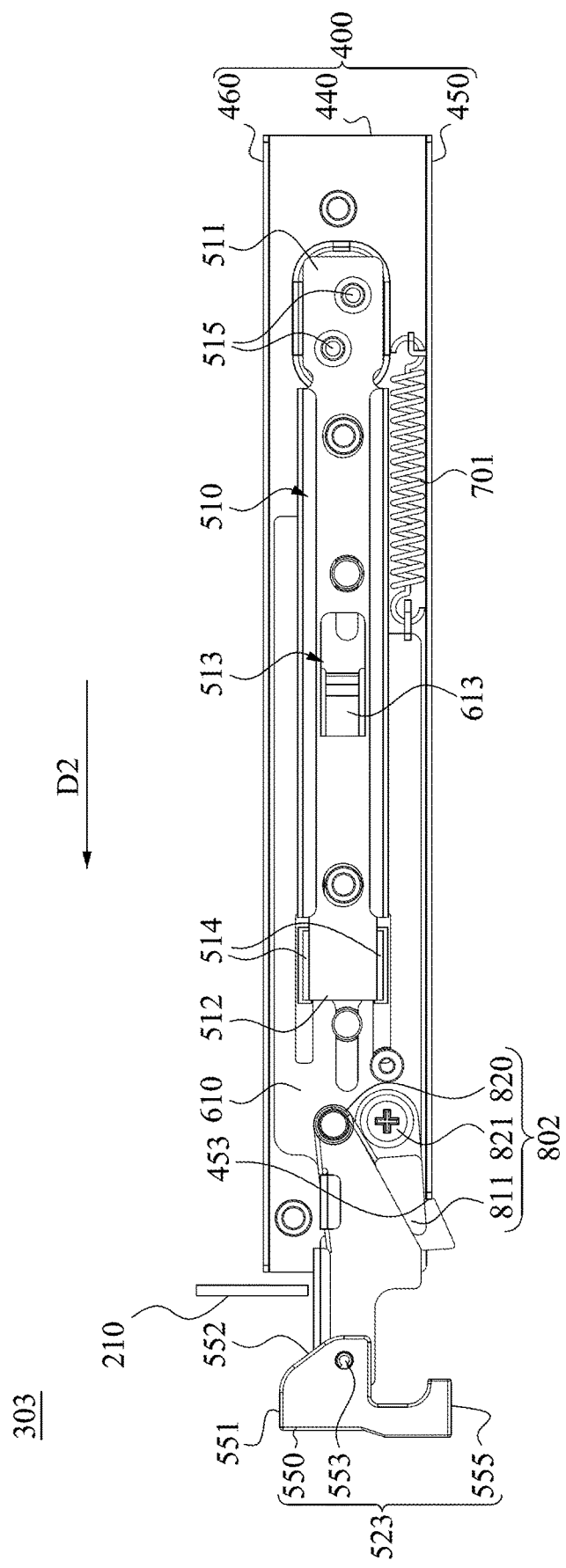
FIG. 9A is an operation schematic view of the latch mechanism of FIG. 8 in an unlocked status.
Figure 9B:
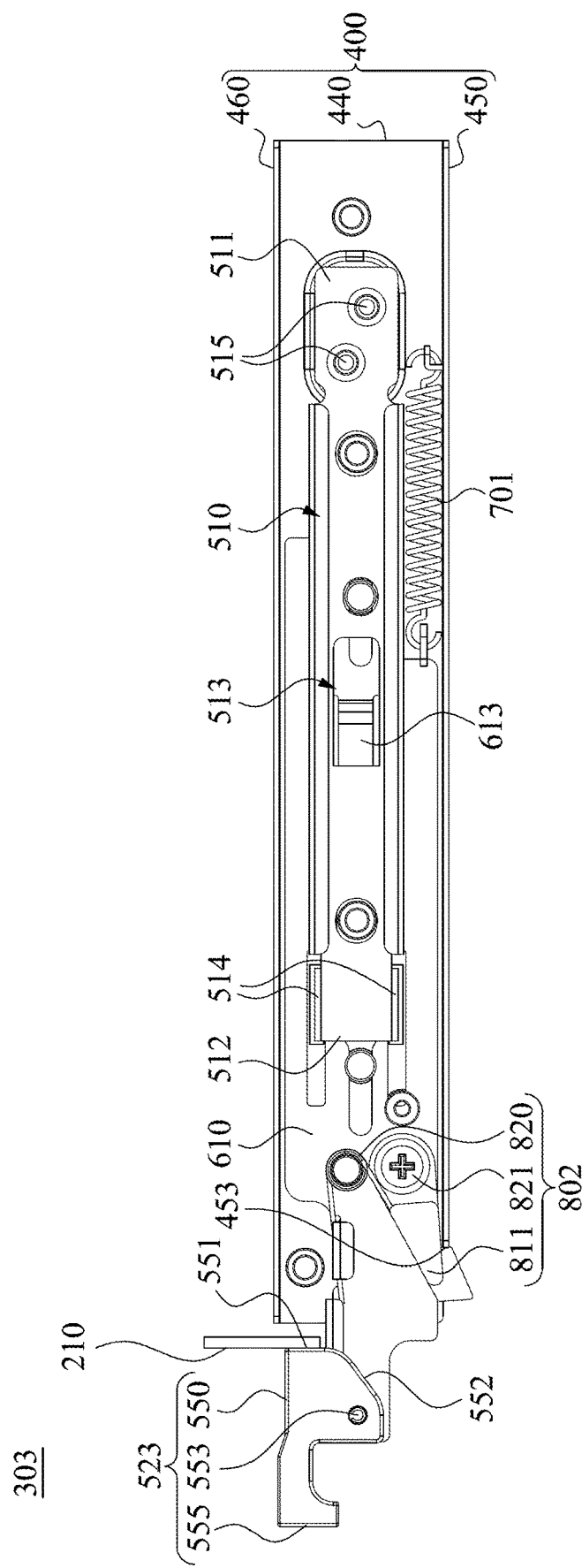
FIG. 9B is an operation schematic view of the latch mechanism of FIG. 8 in a constant unlocked status.
Figure 9C:
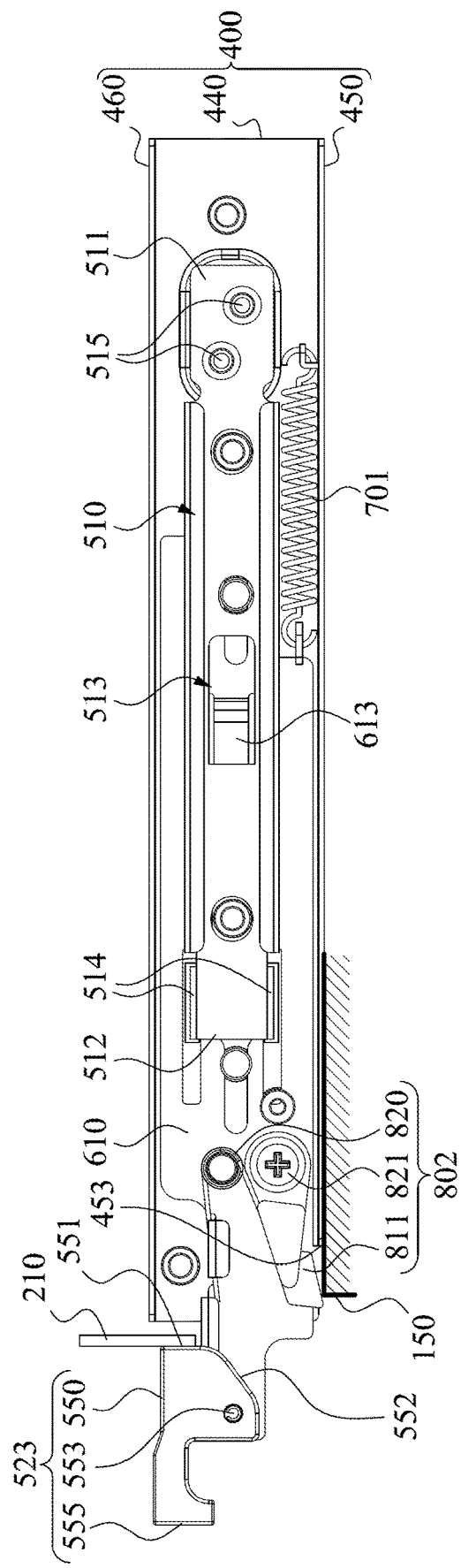
FIG. 9C is an operation schematic view of the latch mechanism of FIG. 9B being no longer hooked.

Reference is now made to FIG. 9A to FIG. 9C in which FIG. 9A is an operation schematic view of the latch mechanism 303 of FIG. 8 in an unlocked status, FIG. 9B is an operation schematic view of the latch mechanism 303 of FIG. 8 in a constant unlocked status, and FIG. 9C is an operation schematic view of the latch mechanism 303 of FIG. 9B being no longer hooked. As shown in FIG. 9A, when the user pulls the grip portion 523 and the sliding bracket 600 leftwards in the traveling direction D2, the hooking portion 802 is hooked on the fastener portion so as to render the latch mechanism 303 into the unlocked status (FIG. 9A). Next, the user rotates the grip portion 523 to directly abut against the blocking surface 210 of the server rack 100 with the abutting portion 551 of the grip portion 523 (FIG. 9B). Therefore, since the sliding bracket 600 is stopped moving by the blocking surface 210 and the aforementioned fastener portion, respectively, the resilient restoring member 700 is still in the aforementioned deformed state so as to fail to release its restoring force. Thus, the sliding bracket 600 cannot be pulled back to the original position by the resilient restoring member 700.

In this way, even if the hook body 811 is pushed back into the accommodation space 420 by the trigger portion 150 so as to remove the position limitation to the sliding bracket 600 by the front end surface 453 of the second plate member 450 (FIG. 9C), however, since the blocking surface 210 of the server rack 100 still stops the sliding bracket 600 from moving in the first traveling direction D1 (FIG. 7B), the sliding bracket 600 still cannot be pulled back to the original position by the resilient restoring member 700. Therefore, the latch mechanism 303 can be back into a constant unlocked status (FIG. 9B) because the stop of the fastener portion to the sliding bracket 600 will not be released by the fastener portion.

Since the abutting portion 551 of the grip portion 523 is farther than the inclined portion 552 from the pivot shaft 553, thus, when the grip portion 523 is rotated relative to the sliding bracket 600 in the rotation direction C1, the blocking surface 210 of the server rack 100 can directly contact against the abutting portion 551 of the grip portion 523; on the other hand, when the grip portion 523 is rotated relative to the sliding bracket 600 in the rotation direction C2, the abutting portion 551 of the server rack 100 fails to directly abut against the blocking surface 210 of the server rack 100 so as to maintain a gap between the blocking surface 210 and the abutting portion 551.

In this way, when the grip portion 523 is rotated so that the abutting portion 551 of the grip portion 523 cannot face the blocking surface 210 of the server rack 100, the abutting portion 551 of the grip portion 523 cannot stop the blocking surface 210 directly, so the sliding bracket 600 is no longer stopped by the fastener portion, the sliding bracket 600 can be pulled back to the original position by the restoring force of the resilient restoring member 700.

Although the disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the disclosure without departing from the scope or spirit of the disclosure. In view of the foregoing, it is intended that the disclosure cover modifications and variations of this disclosure provided they fall within the scope of the following claims and their equivalents.

What is claimed is:

1. A latch mechanism, comprising:
   a frame having an accommodation space and a fastener portion, wherein the fastener portion is an end surface of the frame;
   an elastic sheet disposed in the accommodation space, attached on an inner surface of the frame, and the elastic sheet comprising a fixing portion, a receiving portion, a first free end and a fastening member, the fixing portion that is fixedly connected to the frame, and located opposite to the first free end, the receiving portion that is disposed between the fixing portion and the first free end, and the fastening member that is located at the first free end, and extended out of the frame from the accommodation space;
   a sliding bracket having a bracket body that is slidably disposed between the elastic sheet and the frame, and
   a protruding portion that is elastically and convexly located on the bracket body, and received in the receiving portion;
   a resilient restoring member that is connected to the frame and the sliding bracket; and
   a hooking portion that is connected to the bracket body, and removably hooked on the front end surface of the frame, wherein
   when the sliding bracket pulls the protruding portion, the resilient restoring member and the hooking portion together, the protruding portion is moved to a location between the elastic sheet and the frame so as to move the fastening member into the accommodation space of the frame, to fasten the hooking portion by the front end surface of the frame, and to deform the resilient restoring member so as to store a restoring force capable of returning the protruding portion back to the receiving portion.

2. The latch mechanism of claim 1, wherein the frame comprises a first plate member, and a second plate member that is located at one side of the first plate member, wherein the fixing portion is disposed on the first plate member, and the fastener portion is a front end surface of the second plate member.

3. The latch mechanism of claim 1, wherein the hooking portion comprises a hook body and a torsion spring, the hook body is pivotably connected to the bracket body for hooking the fastener portion, and the torsion spring is connected to the bracket body and the hook body for pushing the hook body towards the fastener portion.

4. The latch mechanism of claim 1, wherein the bracket body comprises a first sheet member and a second sheet member that is located at one side of the first sheet member, and is orthogonal to the first sheet member, wherein the protruding portion is formed on the first sheet member; and
   the hooking portion comprises an elastic arm and a hook member, one end of the elastic arm is integrally formed on the second sheet member, the other end of the elastic arm has a second free end, wherein the hook member is located at the second free end of the elastic arm for hooking on the fastener portion.

5. The latch mechanism of claim 4, wherein the hook member comprises two lugs which are respectively located at two opposite ends of the elastic arm, and commonly extend towards a same direction.

6. The latch mechanism of claim 1, further comprising:
   a grip portion that is connected to one end of the bracket body facing away from the fixing portion.

7. The latch mechanism of claim 6, wherein the grip portion is an L-shaped handle or a ring-shaped handle.

8. The latch mechanism of claim 1, further comprising
   a grip portion comprising a main body, a pivot shaft, and a handle that is connected to the main body, the main body is rotated to one end of the bracket body facing away from the fixing portion, the main body comprises an inclined portion and an abutting portion that is adjacent to the inclined portion and is disposed opposite to the handle, and a minimum linear distance between the pivot shaft and the abutting portion is greater than a minimum linear distance between the pivot shaft and the inclined portion,
   wherein, when the hook portion is fastened to the fastener portion, and the grip portion is rotated about an axis line of the pivot shaft to abut against a fixing object by the abutting portion, because the sliding bracket is detained by the fixing object and the fastener portion, respectively, the resilient restoring member is still deformed to keep storing the restoring force.

9. A server device, comprising:

a server rack comprising an internal space, a first sliding rail, a second sliding rail and a fixing hole, the first sliding rail and the second sliding rail are oppositely arranged in the internal space, and the fixing hole is formed on the first sliding rail;

a chassis removably received in the internal space, and slidably located on the first sliding rail and the second sliding rail; and the latch mechanism of claim 1 that is fixedly disposed on the chassis, and removably hooked in the fixing hole through the fastening member, wherein when the fastening member is pushed into the accommodating space, the fastening member is released from the fixing hole.

10. The server device of claim 9, wherein the server rack further comprises a trigger portion which is an outer end surface of the first sliding rail, wherein, when the chassis moves into the internal space to contact with the trigger portion, the trigger portion disengages the hooking portion from the fastener portion, so that the resilient restoring member releases the restoring force.

11. The server device of claim 9, wherein the chassis is formed with a blocking surface; and the latch mechanism comprising a grip portion, the grip portion comprising a main body, a pivot shaft, and a handle that is connected to the main body, the main body is rotated to one end of the bracket body facing away from the fixing portion, the main body comprises an inclined portion and an abutting portion that is adjacent to the inclined portion and is disposed opposite to the handle, and a minimum linear distance between the pivot shaft and the abutting portion is greater than a minimum linear distance between the pivot shaft and the inclined portion, wherein, when the hook portion is fastened to the fastener portion, and the grip portion is rotated about an axis line of the pivot shaft to abut against a fixing object by the abutting portion, because the sliding bracket is detained by the fixing object and the fastener portion, respectively, the resilient restoring member is still deformed to keep storing the restoring force.

\* \* \* \* \*